US009153942B2

(12) United States Patent
Tsunami et al.

(10) Patent No.: US 9,153,942 B2
(45) Date of Patent: Oct. 6, 2015

(54) METHOD OF MANUFACTURING SEMICONDUCTOR DEVICE

(71) Applicant: Mitsubishi Electric Corporation, Tokyo (JP)

(72) Inventors: Daisuke Tsunami, Tokyo (JP); Hiroyuki Kawahara, Tokyo (JP); Takashi Nagira, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 3 days.

(21) Appl. No.: 14/247,309

(22) Filed: Apr. 8, 2014

(65) Prior Publication Data

US 2015/0244152 A1  Aug. 27, 2015

(30) Foreign Application Priority Data

Feb. 26, 2014 (JP) ................. 2014-035359

(51) Int. Cl.
| H01L 23/52 | (2006.01) |
| H01S 5/343 | (2006.01) |
| H01S 5/042 | (2006.01) |
| H01S 5/026 | (2006.01) |
| H01S 5/10  | (2006.01) |

(52) U.S. Cl.
CPC ............ *H01S 5/34313* (2013.01); *H01S 5/026* (2013.01); *H01S 5/0265* (2013.01); *H01S 5/0421* (2013.01); *H01S 5/1028* (2013.01)

(58) Field of Classification Search
CPC ... H01L 21/302; H01L 33/006; H01L 33/007; H01L 33/0075; H01L 33/0079; H01L 33/16; H01L 33/18; H01L 33/20; H01L 33/22; H01L 33/24; H01S 5/34313; H01S 5/026; H01S 5/1028; H01S 5/0421; H01S 5/0265
USPC ....................... 257/94, 211; 438/40
See application file for complete search history.

(56) References Cited

U.S. PATENT DOCUMENTS

| 5,737,474 A  * | 4/1998  | Aoki et al. ............... 385/131 |
| 7,254,306 B2 * | 8/2007  | Burie et al. .............. 385/131 |
| 2001/0022885 A1 | 9/2001 | Yamada et al. |
| 2002/0111034 A1* | 8/2002 | Watanabe et al. ........... 438/745 |
| 2010/0301306 A1* | 12/2010 | Albo et al. ................ 257/13 |

FOREIGN PATENT DOCUMENTS

| JP | 62-165384 A | 7/1987 |
| JP | 8-116124 A  | 5/1996 |
| JP | 11-202275 A | 7/1999 |
| JP | 11-204879 A | 7/1999 |
| JP | 2002-246684 A | 8/2002 |
| JP | 2006-74069 A | 3/2006 |

* cited by examiner

Primary Examiner — Kevin Parendo
Assistant Examiner — James Chin
(74) Attorney, Agent, or Firm — Leydig, Voit & Mayer, Ltd.

(57) ABSTRACT

A method of manufacturing a semiconductor device, includes forming a laser section on a portion of a substrate, the laser section including an active layer, an upper semiconductor layer on the active layer, and a mask on the upper semiconductor layer; forming a compound semiconductor layer of an indium-containing material in contact with a side of the laser section, the compound semiconductor layer having a projection immediately adjacent the laser section; and wet etching and removing the projection with an etchant containing hydrobromic acid and acetic acid, planarizing the compound semiconductor layer, and producing a (111)A surface in the upper semiconductor layer, under the mask.

7 Claims, 15 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device for use, e.g., in optical communications, etc.

2. Background Art

Japanese Laid-Open Patent Publication No. 2002-246684 discloses that, in the manufacture of a semiconductor device having a ridge stripe, epitaxially growing compound semiconductor layers (e.g., InP burying layers) on both sides of the ridge stripe results in unwanted projections being formed on the compound semiconductor layers. This publication discloses a technique for etching away these projections using an etchant including hydrochloric acid, acetic acid, and hydrogen peroxide solution.

These projections on the compound semiconductor layers should preferably be removed since they serve to degrade the characteristics of the semiconductor device. They can be removed by wet etching. However, it has been found that such a wet etching process may result in etching of the upper semiconductor layer overlying the active layer and formed in contact with the compound semiconductor layers, to such an extent that the active layer is exposed. The exposed surface of the active layer will be oxidized, resulting in a weaker optical confinement in the semiconductor device. Therefore, the projections on the compound semiconductor layers must be removed in such a manner that the active layer is not exposed even if the upper semiconductor layer is etched. Further, the amount of material etched from the upper semiconductor layer must be minimized in order to maintain the optical confinement effect of the upper semiconductor layer.

In the technique disclosed in the above patent publication, when the projections on the compound semiconductor layers described above are removed, the contact layer and the etch rate control layer disposed above the cladding layer (i.e., the upper semiconductor layer) serve to prevent etching of the cladding layer. In order to reliably prevent etching of the cladding layer, however, the contact layer and the etch rate control layer must have a substantial thickness, resulting in increased manufacturing cost. Furthermore, it has been found that the high temperature at which the compound semiconductor layers are formed causes the dopant of the contact layer to diffuse, thereby degrading the characteristics of the semiconductor device.

Further, in order to prevent etching of the cladding layer, the technique of the above patent publication requires that the compound semiconductor layers be formed to have a substantial thickness so that the (111) non-growth surfaces of the projections on these layers are at a higher level than the top surface of the etch rate control layer.

SUMMARY OF THE INVENTION

The present invention has been made to solve the above problems. It is, therefore, an object of the present invention to provide a method of manufacturing a semiconductor device having a ridge stripe, capable of removing projections on the compound semiconductor layers adjacent the ridge stripe without any problem while avoiding exposure of the active layer and minimizing the amount of material etched from the upper semiconductor layer overlying the active layer.

The features and advantages of the present invention may be summarized as follows.

According to one aspect of the present invention, a method of manufacturing a semiconductor device includes a laser section forming step wherein a laser section is formed on a portion of a substrate, the laser section including an active layer, an upper semiconductor layer formed on the active layer, and a mask formed on the upper semiconductor layer, a semiconductor layer forming step wherein a compound semiconductor layer of an indium-containing material is formed in contact with a side of the laser section, the compound semiconductor layer having a projection immediately adjacent the laser section, and a wet etching step wherein the projection is removed by an etchant containing hydrobromic acid and acetic acid so as to planarize the compound semiconductor layer, the wet etching step resulting in a (111)A surface being formed in the upper semiconductor layer under the mask.

Other and further objects, features and advantages of the invention will appear more fully from the following description.

DETAILED DESCRIPTION OF THE PREFERRED EMBODIMENTS

Figure 1:
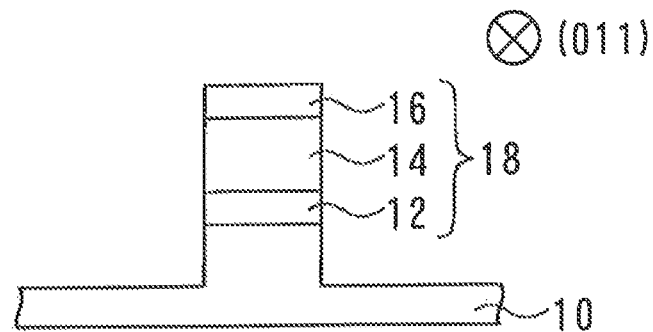
FIG. 1 is a cross-sectional view of the laser section of the first embodiment.

Methods of manufacturing a semiconductor device in accordance with embodiments of the present invention will be described with reference to the accompanying drawings. Throughout the specification the same or corresponding components are designated by the same reference numerals and may be described only once.

First Embodiment

A first embodiment of the present invention provides a method of manufacturing a semiconductor device in which compound semiconductor layers serving as current blocking layers are disposed on both sides of a laser section having a ridge stripe shape. This method begins by forming the laser section, herein designated by reference numeral 18. FIG. 1 is a cross-sectional view of the laser section 18, formed on a substrate 10. The substrate 10 is formed of InP. An active layer 12 is formed on a portion of the substrate 10. The active layer 12 has a multiquantum well structure consisting of alternating stacked InGaAsP quantum well layers and InGaAsP barrier layers. An upper semiconductor layer 14 of InP is formed on the active layer 12.

A mask 16 is formed on the upper semiconductor layer 14. The mask 16 is formed of InGaAs. The active layer 12, the upper semiconductor layer 14, and the mask 16 together form the laser section 18. The step of forming the laser section 18 shown in FIG. 1 is referred to herein as the laser section forming step. In the laser section forming step, first, an active layer, an upper semiconductor layer, and a mask are formed over the entire surface of the substrate 10. Next, the mask is patterned to form a patterned mask 16, and then the portions of the upper semiconductor layer and the active layer that are not covered with the mask 16 are etched away by dry etching or wet etching. This etching also removes a portion of the substrate. In this way the laser section 18 shown in FIG. 1 is formed. It should be noted that a different method may be used to form the laser section 18.

Figure 2:
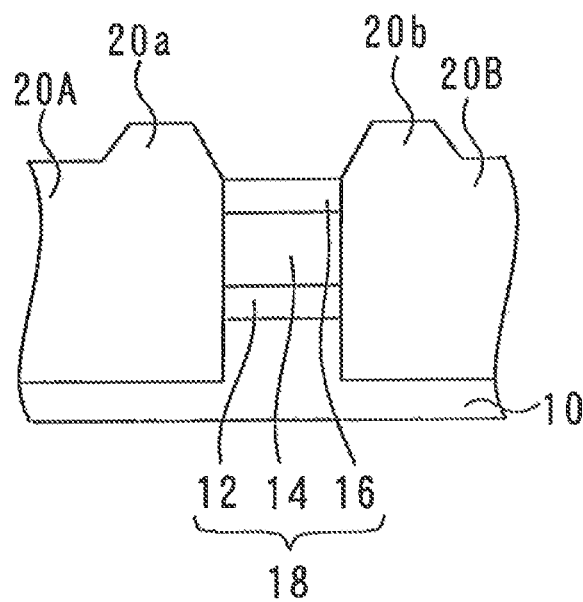
FIG. 2 is a cross-sectional view of the compound semiconductor layers.

Compound semiconductor layers 20A and 20B are then formed. FIG. 2 is a cross-sectional view of the partially completed semiconductor device shown in FIG. 1 after the compound semiconductor layers 20A and 20B have been formed. The compound semiconductor layers 20A and 20B are formed on a (100) surface of the substrate 10 and are in contact with respective opposite sides of the laser section 18. The compound semiconductor layers 20A and 20B are made of InP. The active layer 12 and the upper semiconductor layer 14 are buried or surrounded by the compound semiconductor layers 20A and 20B.

In this example, the compound semiconductor layers 20A and 20B have a pnpn or npnp thyristor structure consisting of alternating stacked layers of p-InP and n-InP. However, the compound semiconductor layers 20A and 20B may have any structure that allows these layers to function as current blocking layers.

The compound semiconductor layers 20A and 20B shown in FIG. 2 have thereon projections 20a and 20b, respectively, which are located immediately adjacent the laser section 18. The projections 20a and 20b project upward from the tops of the compound semiconductor layers 20A and 20B, respectively. The projections 20a and 20b have exposed (111)B surfaces.

The step of forming the compound semiconductor layers 20A and 20B shown in FIG. 2 is referred to herein as the semiconductor layer forming step. In the semiconductor layer forming step, the compound semiconductor layers 20A and 20B are epitaxially grown by metalorganic chemical vapor deposition (MOCVD). As a result, the compound semiconductor layers 20A and 20B have the projections 20a and 20b, respectively, formed thereon. There are two causes that contribute to the formation of the projections 20a and 20b. One of the causes is that different plane orientations exhibit different growth rates (e.g., in an MOCVD process). Specifically, when a Group III-V crystalline material is formed by MOCVD, the rate of supply of Group V material gas is typically set to be higher than the rate of supply of Group III material gas. Under such growth conditions, the growth rate on (111)A surfaces is higher than the growth rate on (100) surfaces, but the growth rate on (111)B surfaces is lower than the growth rate on (100) surfaces. This contributes to the formation of the projections 20a and 20b.

The other cause that contributes to the formation of the projections 20a and 20b is that the material which has been supplied to the surface of the mask 16 migrates to the surface of the semiconductor substrate. As a result, epitaxial growth of a compound semiconductor layer is promoted on the sides of mask 16. This is the reason why the projections 20a and 20b are located immediately adjacent to sides of the mask 16. It should be noted that the height of the projections 20a and 20b varies depending on the growth conditions, etc., but is typically in the range of approximately 0.1 to 3 μm.

Figure 3:
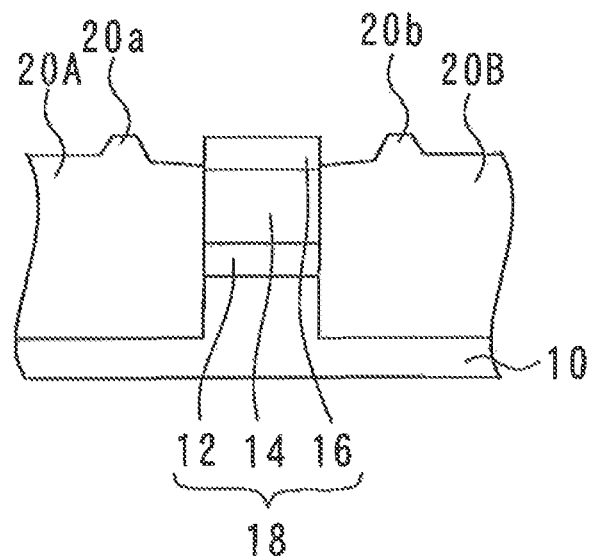
FIG. 3 is a cross-sectional view of the etched compound semiconductor layers.

Next, the projections 20a and 20b are removed by wet etching FIG. 3 is a cross-sectional view of the partially completed semiconductor device shown in FIG. 2 after the wet etching has been halfway completed, showing the etched compound semiconductor layers 20A and 20B, etc. This wet etching uses an etchant composed of hydrobromic acid, acetic acid, and water mixed in a ratio of 1:3:1. This etchant exhibits different etch rates for different crystalline orientations of the object being etched. Specifically, in this wet etching, the etching of successive (111)B planes of the projections 20a and 20b proceeds preferentially to the etching of other planes of the projections 20a and 20b, and as a result these projections are reduced in dimensions as shown in FIG. 3.

Figure 4:
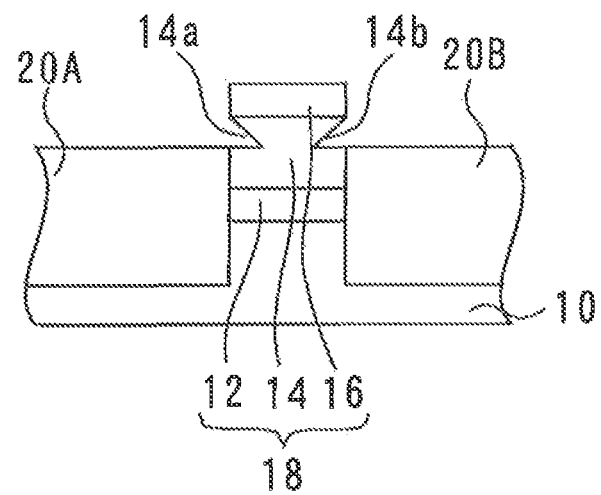
FIG. 4 is a cross-sectional view of the partially completed semiconductor device after the wet etching has been completed.

This wet etching step ends when the projections 20a and 20b have been completely removed and thereby the top surfaces of the compound semiconductor layers 20A and 20B have been flattened. FIG. 4 is a cross-sectional view of the partially completed semiconductor device shown in FIG. 3 after the wet etching has been completed. The upper semiconductor layer 14 is undercut beneath the mask 16 as a result of the wet etching of successive (100) planes of the compound semiconductor layers 20A and 20B. This undercutting results in a (111)A surface 14a and a (111)A surface 14b being formed in the upper semiconductor layer 14, as shown in FIG. 4. The reason why (111)A surfaces, such as the (111)A surfaces 14a and 14b, are formed in the upper semiconductor layer 14 in the wet etching step is that the wet etching (or etchant) exhibits a low etch rate for successive (111)A planes of the upper semiconductor layer 14 relative to other plane orientations and hence the undercutting (or lateral etching) stops at (111)A surfaces.

Thus, the above wet etching results in the (111)A surfaces 14a and 14b being formed in the upper semiconductor layer 14; the upper semiconductor layer 14 has an inverted mesa shape after the wet etching step. It should be noted that in this example the ridge stripe direction is [011]. If the ridge strip direction is [0-11], then the upper semiconductor layer 14 has a mesa shape after the above wet etching step.

Thus, the wet etching step is performed to planarize the top surfaces of the compound semiconductor layers 20A and 20B and thereby expose (100) surfaces at these top surfaces while forming (111)A surfaces in sides of the upper semiconductor layer 14.

Since the primary purpose of the wet etching step is to remove the projections 20a and 20b from the compound semiconductor layers 20A and 20B, it is desirable to minimize etching of (100) planes of the compound semiconductor layers 20A and 20B. This may be accomplished by use of an etchant composed of, e.g., hydrobromic acid, acetic acid, and water mixed in a ratio of 1:3:1, as described above.

In an experiment, the present inventor found that the above etchant exhibited an etch rate of 30 nm/min for (100) planes of the compound semiconductor layers 20A and 20B, etc. and an etch rate of 4500 nm/min for (0-11) planes of the projections 20a and 20b in the wet etching step. This means that by using this etchant it is possible to etch (0-11) and (01-1) planes at a substantially faster rate than (100) planes. The reason for this is that the etchant is composed of hydrobromic acid, acetic acid, and water, as described above, and the plane orientation dependence of the etch rate of the hydrobromic acid is enhanced by the acetic acid.

However, the etch rate of (0-11) planes in the etchant depends on the concentration of the etchant; dilution of the etchant by water decreases the plane orientation dependence of the etch rate of the etchant. Further, in the above example the etch rate of (0-11) planes of the projections 20a and 20b is high since these projections do not have a mask thereon. However, if the projections 20a and 20b has a mask thereon, the etchant does not substantially etch (0-11) planes of these projections, even if the projections have exposed (111)B surfaces.

If the substrate 10 is damaged or its surface roughness is increased by the dry etching for forming the laser section 18 shown in FIG. 1, then the top surface of the substrate 10 may include a surface or surfaces other than a (100) surface when the substrate 10 is subjected to the subsequent wet etching step for removing the projections 20a and 20b. If this occurs, the etch rate of (100) planes in the wet etching step will be increased up to, e.g., 56 nm/min. Therefore, the above dry etching of the substrate 10 must be performed in such a manner as to minimize damage to the top (100) surface of the substrate 10 and thereby minimize increase in the surface roughness of the substrate 10.

Figure 5:
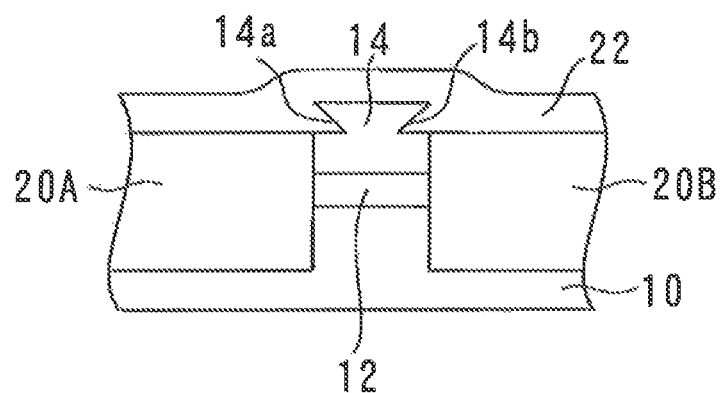
FIG. 5 is a cross-sectional view of contact layer.

Next, the mask 16 is removed, and a contact layer 22 is formed. FIG. 5 is a cross-sectional view of the partially completed semiconductor device shown in FIG. 4 after the contact layer 22 has been formed. The contact layer 22 is epitaxially grown of InGaAs and covers the compound semiconductor layers 20A and 20B and the upper semiconductor layer 14.

Figure 6:
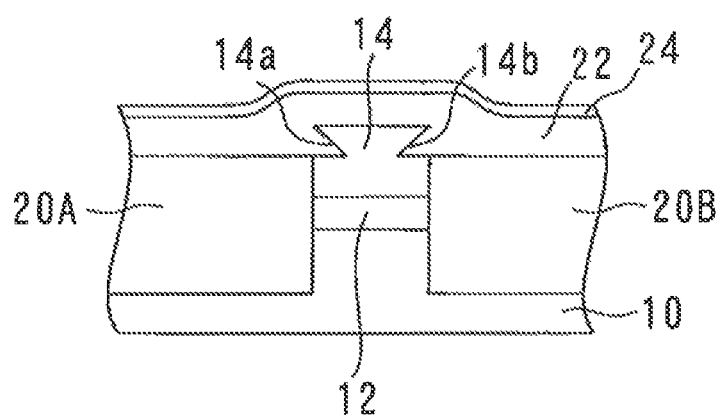
FIG. 6 is a cross-sectional view of the resist.
Figure 7:
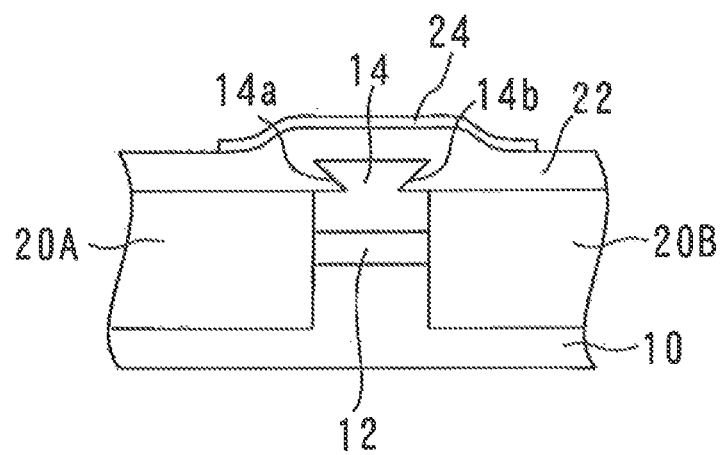
FIG. 7 is a cross-sectional view of the patterned resist.
Figure 8:
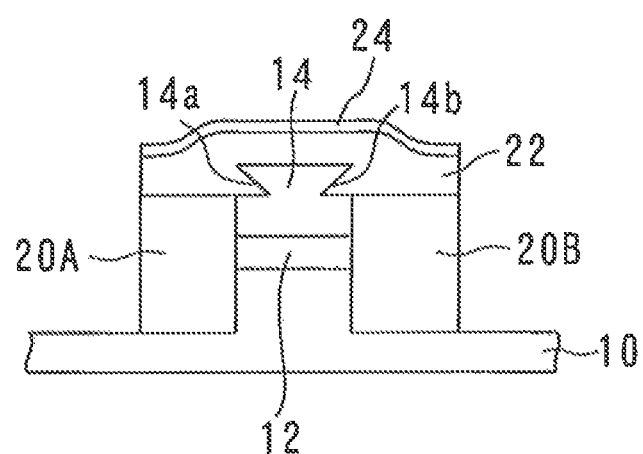
FIG. 8 is a cross-sectional view of the partially completed semiconductor device after the wet etching has been completed.

A resist 24 is then formed. FIG. 6 is a cross-sectional view of the partially completed semiconductor device shown in FIG. 5 after the resist 24 has been formed. The resist 24 covers the entire surface of the device. The resist 24 is then patterned. FIG. 7 is a cross-sectional view of the partially completed semiconductor device shown in FIG. 6 after the resist 24 has been patterned. Portions of the contact layer 22 and the compound semiconductor layers 20A and 20B are then removed by wet etching using the patterned resist 24 as a mask. FIG. 8 is a cross-sectional view of the partially completed semiconductor device shown in FIG. 7 after the wet etching has been completed. Subsequently, after the resist 24 is removed, an insulating film and electrodes are formed, thereby completing the process of forming and processing the components on the top side of the semiconductor device of the present embodiment. Next, the substrate is thinned to a thickness of approximately 100 μm and then a bottom surface electrode is formed on the bottom surface of the substrate. The resulting semiconductor device structure is then split into individual semiconductor devices (or chips), thus completing the method of manufacturing a semiconductor device in accordance with the present embodiment. It should be noted that each semiconductor device (or chip) which has been manufactured by the method of the present embodiment is covered on its edges by a coating film and then subjected to an assembly step (including packaging, etc.) to produce a finished product.

If a contact layer were epitaxially grown on the compound semiconductor layers 20A and 20B shown in FIG. 2 without removing the projections 20a and 20b (that is, without performing the above wet etching step), crystal defects and dislocations might develop in the contact layer. In such cases, when a portion of the contact layer is removed by the subsequent wet etching step, portions of the contact layer containing a defect or dislocation are preferentially etched, thereby preventing the contact layer from being shaped into the desired uniform shape. Since the contact layer is located adjacent the optical waveguide, the nonuniform shape of the contact layer affects the effective refractive index of the optical waveguide so that the light traveling through the optical waveguide will be diffused or reflected.

Further, the remaining projections 20a and 20b would adversely affect the accuracy with which the resist 24 is formed and patterned in a subsequent step, and would cause defects in the electrode film formed on the contact layer in a further subsequent step. Thus, if the manufacturing process were continued without removing the projections 20a and 20b from the compound semiconductor layers 20A and 20B, respectively, after forming these layers, the subsequent process steps would not produce the desired results.

In order to avoid this from happening, the method of manufacturing a semiconductor device in accordance with the first embodiment includes, after forming the compound semiconductor layers 20A and 20B, removing the projections 20a and 20b from these layers in a wet etching step so as to planarize the compound semiconductor layers 20A and 20B. This serves to avoid the problems described above.

If an etchant composed of, e.g., hydrochloric acid, acetic acid, hydrogen peroxide solution, and water were used in the above wet etching step for removing the projections 20a and 20b, (111)A surfaces would be unlikely to be formed in the upper semiconductor layer 14 in the step although the projections 20a and 20b would be removed by the etchant. (It should be noted that the etchant exhibits a low etch rate for (111)A planes of the upper semiconductor layer 14 relative to other plane orientations.) Consequently, in the wet etching step the undercutting, or lateral etching, of the upper semiconductor layer 14 would proceed in an unrestrained manner resulting in delamination of the mask on the upper semiconductor layer 14. This delamination of the mask would further facilitate etching of the upper semiconductor layer 14, leading to exposure of the active layer.

In order to avoid this, in accordance with the first embodiment the wet etching step uses an etchant composed of hydrobromic acid, acetic acid, and water mixed in a ratio of 1:3:1, as described above. The use of this etchant in the wet etching step has three major advantages. A first major advantage is that (111)A surfaces are formed in the upper semiconductor layer 14 and substantially resist further etching, making it possible to stop undercutting of the upper semiconductor layer 14. This means that removal of the mask on the upper semiconductor layer 14 can be prevented in the wet etching step, thereby avoiding exposure of the active layer. It should be noted that the term "(111)A surface" as used herein also refers to any surface which has resistance to etching comparable to a (111)A surface.

A second major advantage is that the etchant exhibits a high etch rate for (111)B planes of the projections 20a and 20b and hence can be used to quickly remove these projections, since the etchant is composed of hydrobromic acid, acetic acid, and water mixed in a ratio of 1:3:1. The use of this etchant allows the projections 20a and 20b to be quickly laterally etched while stopping undercutting of the upper semiconductor layer 14. The reason for this is considered to be that the projections 20a and 20b cannot retain a (111)A surface during the wet etching since they are not covered with a mask, whereas the upper semiconductor layer 14 can retain a formed (111)A surface during the wet etching since it is covered with the mask 16.

The third major advantage is that since the etchant is composed of hydrobromic acid, acetic acid, and water mixed in a ratio of 1:3:1, it exhibits a relatively low etch rate for (100) planes, making it possible to minimize etching of (100) planes of the upper semiconductor layer 14, etc. The first to third major advantages of the etchant together allow the projections 20a and 20b to be quickly removed in the wet etching step while avoiding delamination of the mask on the upper semiconductor layer 14 and minimizing etching of (100) planes of the upper semiconductor layer 14, etc.

Thus, the method of manufacturing a semiconductor device removes the projections 20a and 20b from the compound semiconductor layers 20A and 20B in a wet etching step while preventing exposure of the active layer and minimizing the amount of material etched from the upper semiconductor layer 14. Further, this wet etching step for removing the projections 20a and 20b, etc. does not use a contact layer as a mask and hence the contact layer 22 is formed after the wet etching step. This makes it possible to form the contact layer 22 to the desired thickness. Further, if the contact layer 22 were formed before forming the compound semiconductor layers 20A and 20B, the dopant in the contact layer 22 would diffuse into the compound semiconductor layers 20A and 20B due to heat during the formation of the compound semiconductor layers. The method of the present embodiment avoids this problem since the contact layer 22 is formed after, not before, the compound semiconductor layers 20A and 20B are formed. Further, since the undercutting of the upper semiconductor layer 14 stops at (111)A surfaces formed therein during the wet etching step, there is no need to increase the thickness of the compound semiconductor layers 20A and 20B in order to prevent undercutting of the upper semiconductor layer 14, making it possible to form the compound semiconductor layers 20A and 20B to any desired thickness.

It should be noted that in the wet etching step for removing the projections 20a and 20b, etc., if the adhesion between the mask 16 and the upper semiconductor layer 14 is low, the etchant will enter the interface between the mask 16 and the upper semiconductor layer 14, leading to substantial undercutting of the upper semiconductor layer 14. In the method of manufacturing a semiconductor device in accordance with the first embodiment, the mask 16 is formed of InGaAs and therefore the adhesion between the mask 16 and the upper semiconductor layer 14 is relatively high, as compared to cases where the mask 16 is formed of $SiO_2$. It should be noted that the mask 16 is preferably epitaxially grown in order to enhance the adhesion between the mask 16 and the upper semiconductor layer 14.

Figure 9:
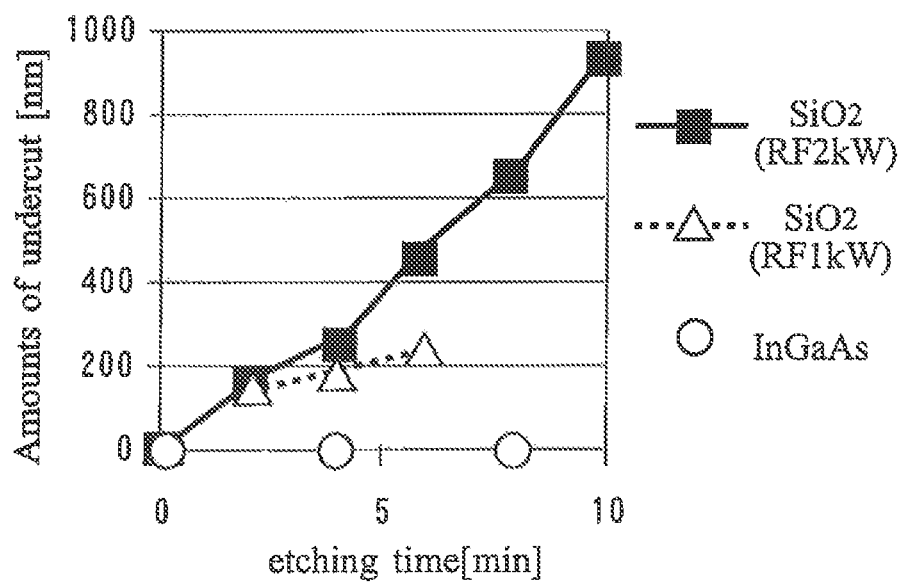
FIG. 9 is a graph of the measured amounts of undercut as a function of etching time.

FIG. 9 is a graph of the measured amounts of undercut formed in three samples of the upper semiconductor layer 14 during wet etching as a function of etching time, with these samples having different types of masks thereon. Specifically, an undercut was formed in the portion of each sample immediately underlying a respective mask. A first one of the masks was an $SiO_2$ layer having a thickness of 100 nm formed by sputtering at an RF power of 2 kW, a second one of the masks was an $SiO_2$ layer having a thickness of 400 nm formed by sputtering at an RF power of 1 kW, and the third one of the masks was an InGaAs layer having a thickness of 500 nm formed by MOCVD. The etchant used in this wet etching was composed of hydrobromic acid, acetic acid, and water mixed in a ratio of 1:3:1.

As shown in FIG. 9, a small amount of undercut was formed in each sample with an $SiO_2$ mask layer thereon. However, the sample with an InGaAs mask layer thereon did not exhibit any undercut. The reason for this is considered to be that the adhesion between an InP layer (e.g., the upper semiconductor layer 14) and an InGaAs layer formed thereon is higher than the adhesion between an InP layer and an $SiO_2$ layer formed thereon.

The mask 16 may be made of any material that allows the etch rate of the mask 16 to be lower than the etch rate of the projections 20a and 20b in the wet etching step for removing these projections. For example, the mask 16 may be an insulating film, such as a silicon oxide film ($SiO_2$) or a silicon nitride film (SiN), or an epitaxial layer of InP, AlInP, InGaP, AlGaInP, InGaAsP, InAs, InGaAs, AlInAs, AlGaInAs, or GaInNAs, etc. It should be noted that the mask 16 should preferably be formed of a material having a high Ga or As mole fraction, since such materials enable the etch rate of the mask 16 to be relatively low in the wet etching step for removing the projections 20a and 20b, etc.

The compound semiconductor layers 20A and 20B may be made of any material containing In. For example, the compound semiconductor layers 20A and 20B may be epitaxial layers formed of InP, AlInP, InGaP, AlGaInP, InGaAsP, InAs, InGaAs, AlInAs, AlGaInAs, or GaInNAs. Further, the compound semiconductor layers 20A and 20B may be doped with Ru, Zn, S, Fe, Be, or Mg.

The etchant used in the wet etching step for removing the projections 20a and 20b may be any suitable etchant containing hydrobromic acid and acetic acid. For example, the etchant may be composed of hydrobromic acid, acetic acid, and at least one of water, nitric acid, hydrogen peroxide solution, and bromine.

The laser section 18 need not be shaped like a mesa with vertical sidewalls, but may have an ordinary mesa shape or an inverted mesa shape, or may have any other suitable shape. These alterations may also be made to the methods of manufacturing a semiconductor device in accordance with the subsequently described embodiments.

The methods of manufacturing a semiconductor device in accordance with the following embodiments of the invention have many features common to the method of manufacturing a semiconductor device in accordance with the first embodiment. Therefore, the description of these methods will be primarily limited to the differences from the method of the first embodiment.

Second Embodiment

Figure 10:
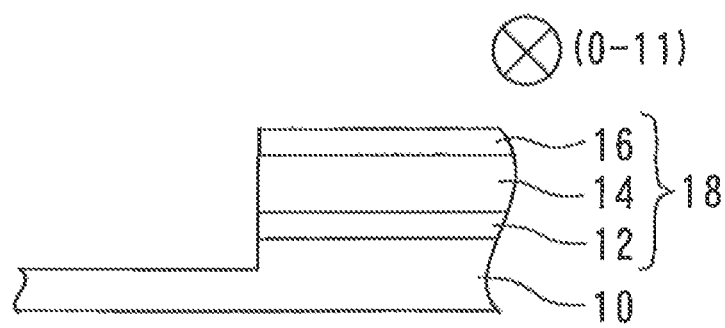
FIG. 10 is a cross-sectional view of the laser section of the second embodiment.

Whereas in the first embodiment of the present invention compound semiconductor layers serving as current blocking layers are formed, in a second embodiment of the present invention a compound semiconductor layer serving as an optical modulator is formed. Specifically, the second embodiment provides a method of manufacturing a semiconductor device configured as a laser diode with an optical modulator. This method begins by forming a laser section 18 in a laser section forming step, as shown in FIG. 10.

Figure 11:
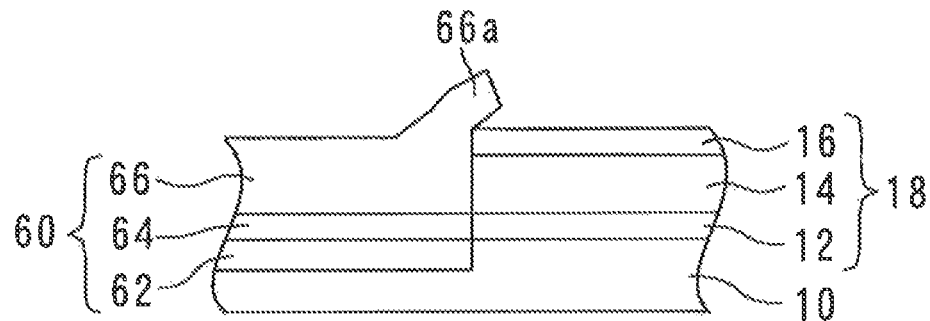
FIG. 11 is a cross-sectional view of the compound semiconductor layer.

Next, a compound semiconductor layer 60 is formed in a semiconductor layer forming step, as shown in FIG. 11. The compound semiconductor layer 60 is configured as an optical modulator and is in contact with a (011) surface or (0-1-1) surface of the laser section 18. The compound semiconductor layer 60 includes a cladding layer 62 formed on the substrate 10, an active layer 64 formed on the cladding layer 62, and a cladding layer 66 formed on the active layer 64. Since these layers are formed by MOCVD, the cladding layer 66 has a projection 66a formed in contact with the laser section 18.

Figure 12:
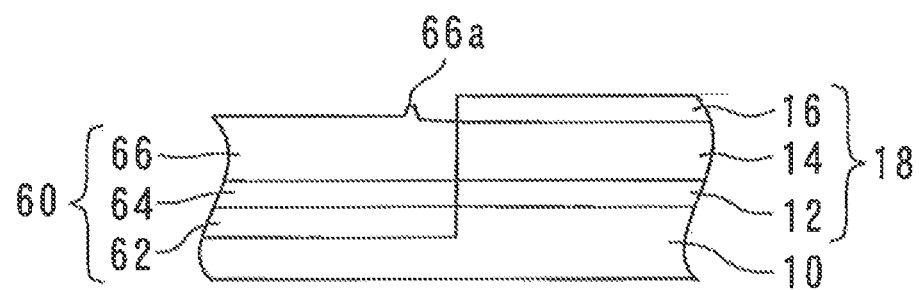
FIG. 12 is a cross-sectional view of the etched compound semiconductor layer.

The method then proceeds to a wet etching step. In this wet etching step, the projection 66a is removed using an etchant essentially composed of a mixture (1:3:1) of hydrobromic acid, acetic acid, and water and containing an oxidant such as nitric acid, hydrogen peroxide solution, or bromine FIG. 12 is a cross-sectional view of the partially completed semiconductor device shown in FIG. 11 after an initial stage of the wet etching step has been completed, showing the etched projection 66a.

Figure 13:
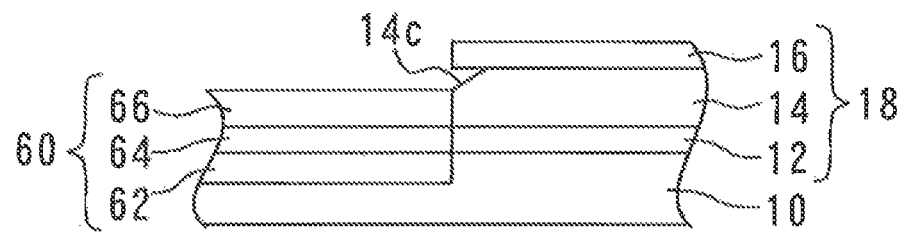
FIG. 13 is a cross-sectional view of the partially completed semiconductor device after the wet etching has been completed.

This wet etching step ends when the projection 66a has been completely removed and thereby the top surface of the cladding layer 66 has been flattened. FIG. 13 is a cross-sectional view of the partially completed semiconductor device shown in FIG. 12 after the wet etching step has been completed. As shown in FIG. 13, a (111)A surface 14c is formed in a side of the upper semiconductor layer 14 beneath the mask 16 as a result of the etching of successive (100) planes of the cladding layer 66. The etching of the upper semiconductor layer 14 stops at the (111)A surface 14c.

It should be noted that since, in the semiconductor layer forming step of the second embodiment, the compound semiconductor layer 60 is grown in the [011] or [0-1-1] direction as well as in the [100] direction, the projection 66a of the compound semiconductor layer 60 may have a (111)A surface, which is difficult to etch by use of an etchant containing hydrobromic acid and acetic acid.

In order to overcome this problem, in the second embodiment the wet etching step for removing the projection 66a uses an etchant including an oxidant (such as nitric acid, hydrogen peroxide solution, or bromine), in addition to including hydrobromic acid, acetic acid, and water, to increase the etch rate for (111)A planes. This ensures complete removal of the projection 66a. The oxidant contained in the etchant makes it possible to promote etching of (111)A planes of the projection 66a while minimizing etching of (111)A planes of the upper semiconductor layer 14. The reason for this is that in addition to (111)A planes other planes of the projection 66a are etched at a substantial rate in the above wet etching step since the projection 66a is not covered with a mask, whereas planes of the upper semiconductor layer 14 other than (111)A planes are etched only at a low rate since the upper semiconductor layer 14 is covered with the mask 16.

Third Embodiment

Figure 14:
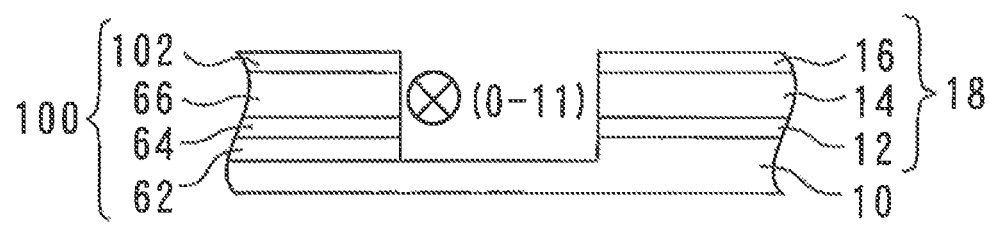
FIG. 14 is a cross-sectional view of the laser section of the third embodiment.

A method of manufacturing a semiconductor device in accordance with a third embodiment of the present invention forms a laser diode, an optical modulator, and an optical waveguide on a substrate. Specifically, the method begins by forming a laser section 18 on a substrate 10 in a laser section forming step, as shown in FIG. 14. An optical modulator 100 is then formed on the substrate 10. The optical modulator 100 has a mask layer 102 of InGaAs at its top.

Figure 15:
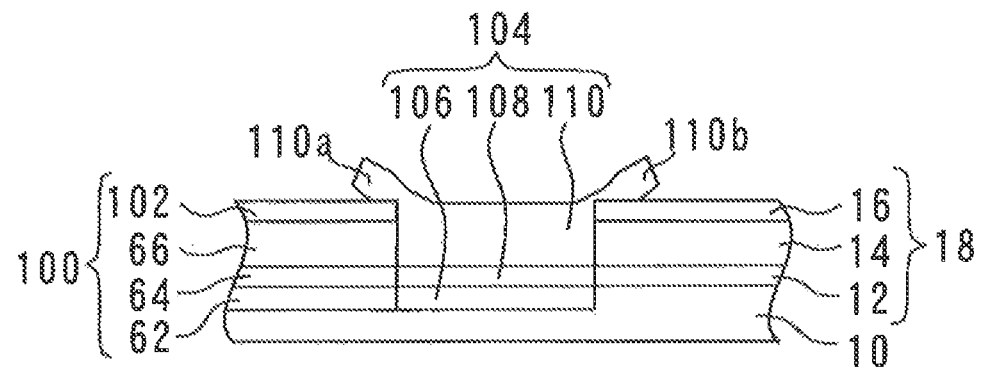
FIG. 15 is a cross-sectional view of the compound semiconductor layer.

Next, a compound semiconductor layer 104 is formed in a semiconductor layer forming step, as shown in FIG. 15. The compound semiconductor layer 104 is in contact with a (011) surface or (0-1-1) surface of the laser section 18 and in contact with a (011) surface or (0-1-1) surface of the optical modulator 100. The compound semiconductor layer 104 includes a cladding layer 106 of InP, an active layer 108 of InGaAsP/InGaAsP formed on the cladding layer 106, and a cladding layer 110 of InP formed on the active layer 108. The compound semiconductor layer 104 is formed by MOCVD and has projections 110a and 110b thereon.

Figure 16:
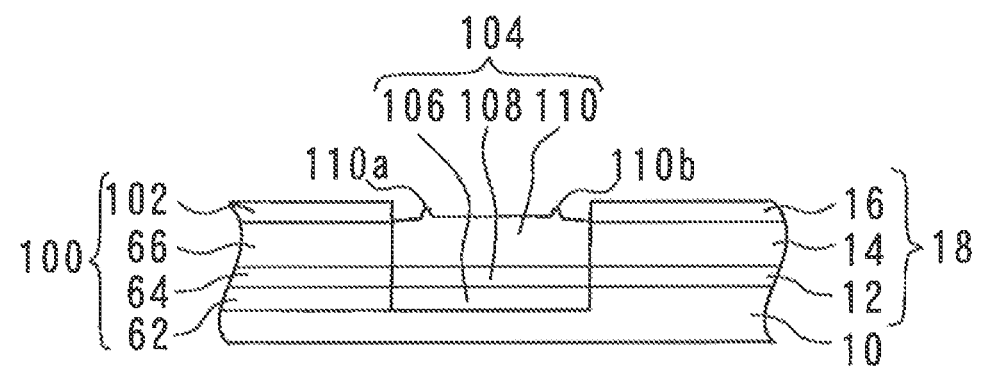
FIG. 16 is a cross-sectional view of the etched compound semiconductor layers.

The method then proceeds to a wet etching step. This wet etching step uses an etchant composed of hydrobromic acid, acetic acid, and water mixed in a ratio of 1:3:1. FIG. 16 is a cross-sectional view of the partially completed semiconductor device shown in FIG. 15 after an initial stage of the wet etching step has been completed, showing the etched compound semiconductor layer 104, etc. This wet etching step ends when the projections 110a and 110b have been completely removed and thereby the top surface of the cladding layer 110 has been flattened.

Figure 17:
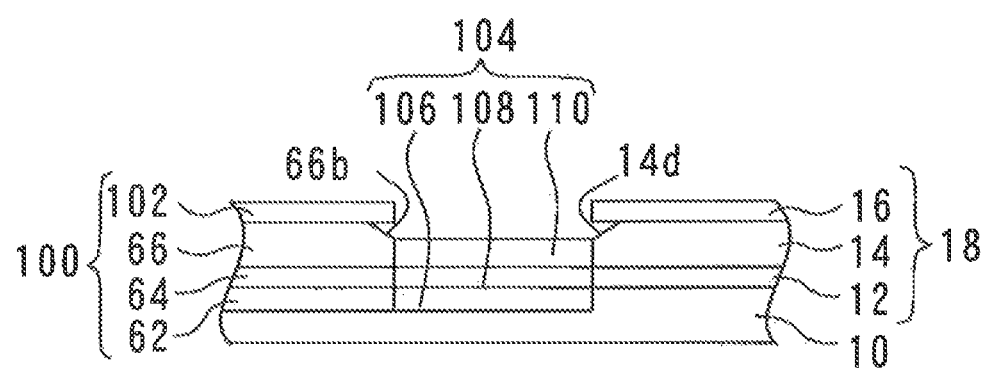
FIG. 17 is a cross-sectional view of the partially completed semiconductor device after the wet etching has been completed.

FIG. 17 is a cross-sectional view of the partially completed semiconductor device shown in FIG. 16 after the wet etching step has been completed. As a result of the etching of successive (100) planes of the cladding layer 110, a (111)A surface 14d is formed in a side of the upper semiconductor layer 14 and a (111)A surface 66b is formed in a side of the cladding layer 66, as shown in FIG. 17. The undercutting, or lateral etching, of the upper semiconductor layer 14 stops at the (111)A surface 14d, and the undercutting of the cladding layer 66 stops at the (111)A surface 66b. It should be noted that the etchant used may contain an oxidant.

Thus, the method of manufacturing a semiconductor device in accordance with the third embodiment removes the projections 110a and 110b from the compound semiconductor layer 104 in a wet etching step while preventing exposure of the active layers 12, 64, and 108 and minimizing the amount of material etched from the upper semiconductor layer 14 and the cladding layers 66 and 110. The methods of manufacturing a semiconductor device in accordance with the second and third embodiments are used to manufacture a composite device in which a laser section and another or other elements are formed on the same substrate. In the manufacture of such a device, epitaxial growth is carried out on a compound semiconductor layer (or layers) a plurality of times, not just one time, making it all the more necessary to remove a projection (if any) on the compound semiconductor layer. The methods of manufacturing a semiconductor in accordance with the present invention provides an effective and reliable way to remove such projections. Although the present invention has been described in connection with forming a compound semiconductor layer configured as an optical modulator or an optical waveguide, it is to be understood that the present invention may be applied to forming a compound semiconductor layer configured as an optical coupler, an optical amplifier, an EA modulator, or a phase modulator.

Fourth Embodiment

Figure 18:
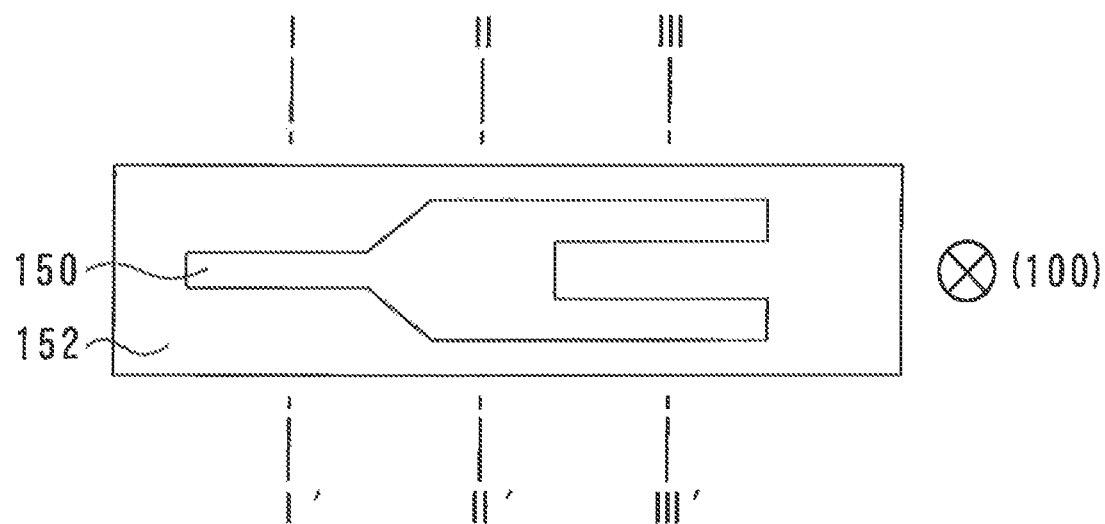
FIG. 18 is a plan view of a semiconductor device in accordance with the fourth embodiment.

A method of manufacturing a semiconductor device in accordance with a fourth embodiment of the present invention forms an optical multiplexer/demultiplexer which uses multi-mode interference (MMI). FIG. 18 is a plan view of a semiconductor device (configured as an optical multiplexer/demultiplexer) in accordance with the fourth embodiment. This semiconductor device includes a ridge stripe 150 and a compound semiconductor layer 152 burying or surrounding the ridge stripe 150. The ridge stripe 150 extends in the longitudinal direction of the compound semiconductor layer 152 (or the semiconductor device) and may be divided into a left portion, a center portion, and a right portion, as viewed in FIG. 18, which have different shapes. Specifically, the left portion of the ridge stripe 150 is a narrow strip or band; the central portion of the ridge stripe 150 is a wide strip substantially wider than the left portion and has a narrowed left end which is connected to the right end of the left portion; and the right portion of the ridge stripe 150 is made up of two parallel strips or bands which extend from the right end of the center portion. It should be noted that the ridge stripe 150 may have a different shape in order to optimize the optical transmission efficiency therethrough.

Figure 19A:
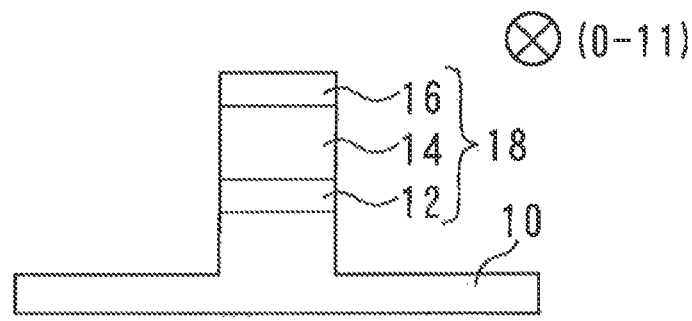
FIGS. 19A, 19B, 19C show laser section forming step.
Figure 19B:
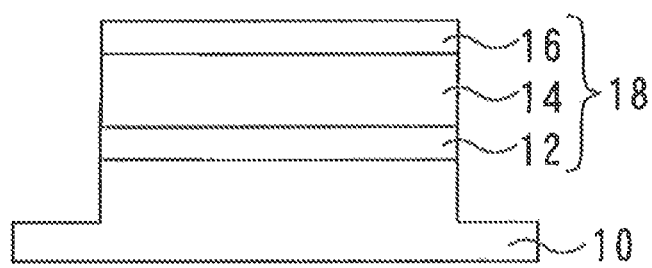
Figure 19C:
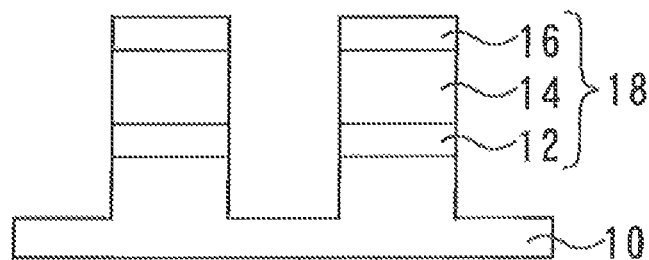
Figure 20A:
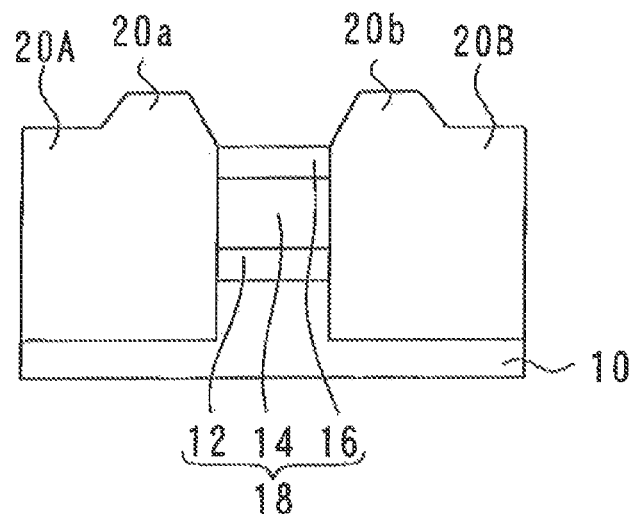
FIGS. 20A, 20B, 20C show semiconductor layer forming step.
Figure 20B:
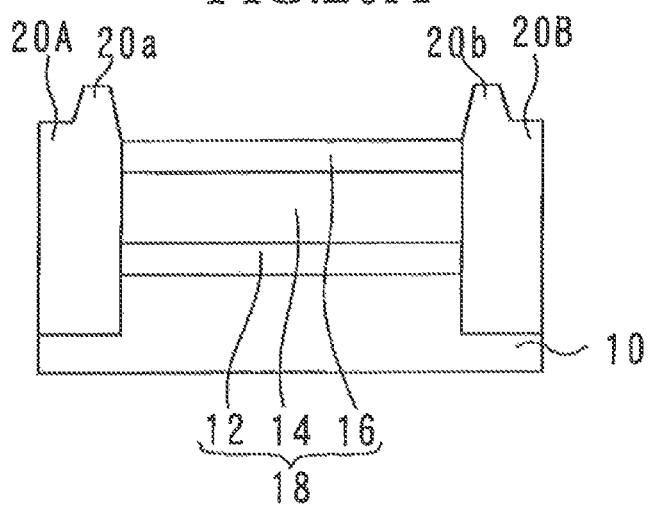
Figure 20C:
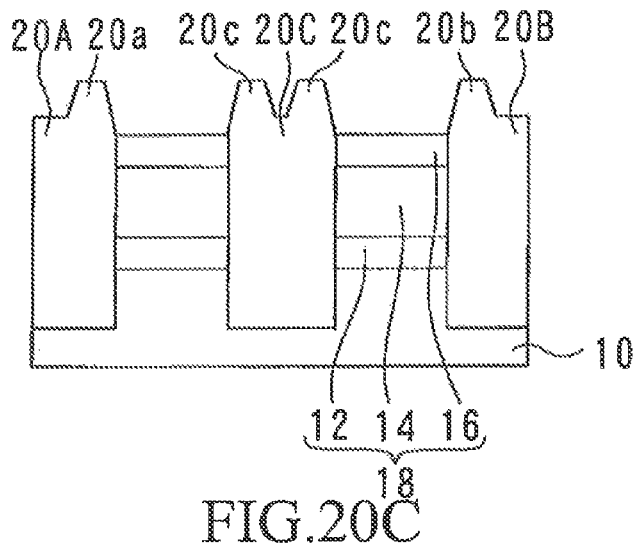

The method begins by forming a laser section 18 in a laser section forming step, as shown in FIG. 19, which includes FIGS. 19A, 19B, and 19C. FIG. 19A shows a cross-section of a partially completed semiconductor device in accordance with the fourth embodiment after the laser section 18 has been formed, this cross-section corresponding to the cross-section taken along line I-I' of FIG. 18. FIG. 19B is shows another cross-section of the partially completed semiconductor device, this cross-section corresponding to the cross-section taken along line II-II' of FIG. 18. FIG. 19C shows still another cross-section of the partially completed semiconductor device, this cross-section corresponding to the cross-section taken along line III-III' of FIG. 18. It should be noted that FIGS. 20, 21, and 22 described below also each include three cross-sectional views, indicated respectively by the letters A, B, and C, as in FIG. 19. These three cross-sectional views show cross-sections corresponding to the cross-sections shown in FIGS. 19A, 19B, and 19C. For example, FIGS. 20A, 20B, and 20C show cross-sections of a partially completed semiconductor device which correspond to the cross-sections shown in FIGS. 19A, 19B, and 19C, respectively.

Next, compound semiconductor layers 20A, 20B, and 20C are formed in a semiconductor layer forming step, as shown in FIG. 20. The compound semiconductor layers 20A, 20B, and 20C are formed of InP and function as current blocking layers. The compound semiconductor layer 20A has a projection 20a thereon, the compound semiconductor layer 20B has a projection 20b thereon, and the compound semiconductor layer 20C has projections 20c thereon.

Figure 21A:
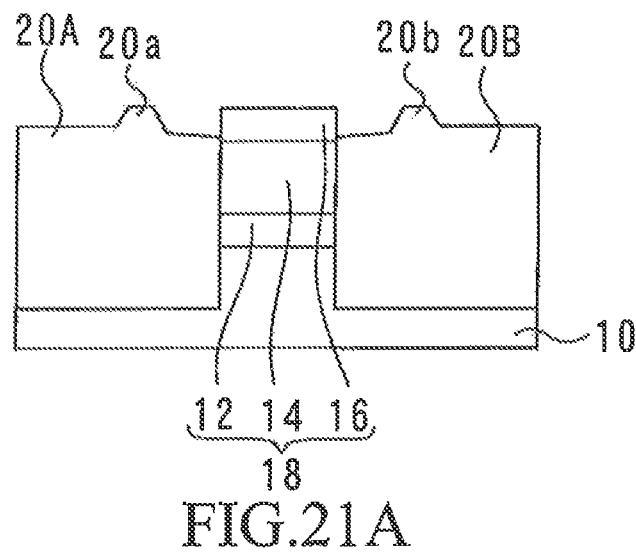
FIGS. 21A, 21B, 21C show initial stage of the wet etching step.
Figure 21B:
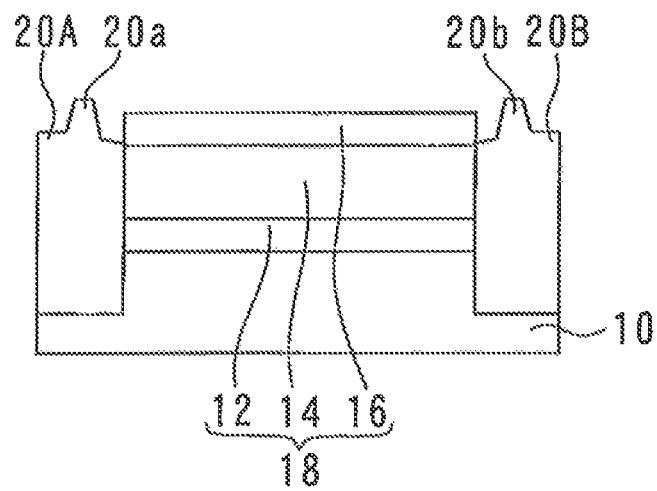
Figure 21C:
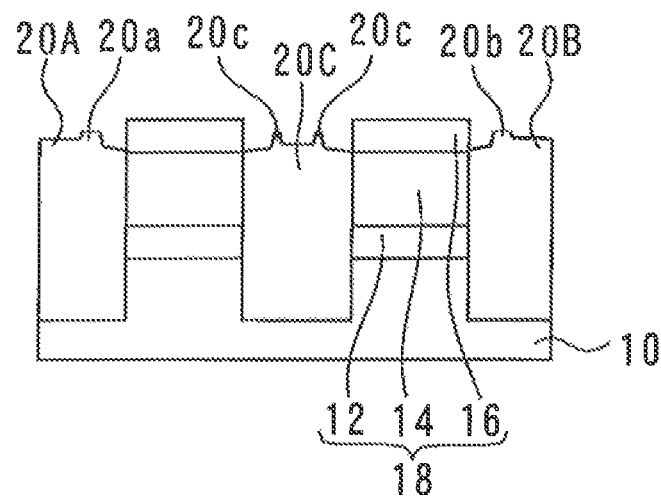
Figure 22A:
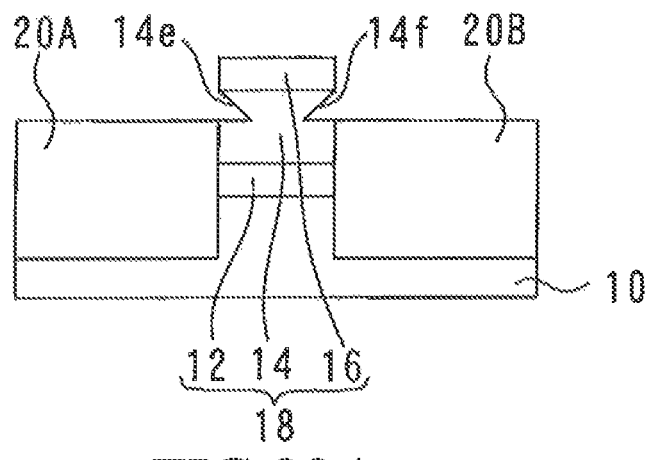
FIGS. 22A, 22B, 22C show wet etching step.
Figure 22B:
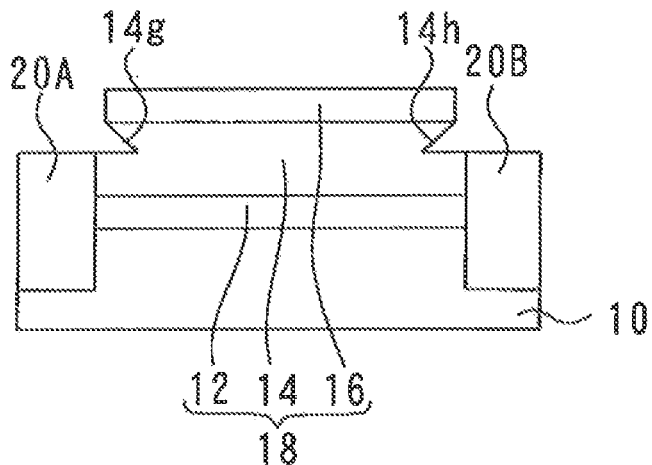
Figure 22C:
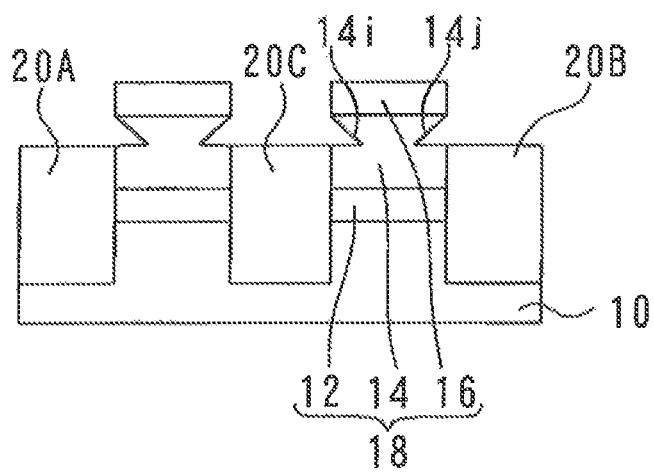

The projections 20a, 20b, and 20c are then removed in a wet etching step. This wet etching step uses an etchant composed of hydrobromic acid, acetic acid, and water mixed in a ratio of 1:3:1. FIG. 21 includes FIGS. 21A, 21B, and 21C which are cross-sectional views of the partially completed semiconductor device shown in FIG. 20 after an initial stage of the wet etching step has been completed. This wet etching step ends when the projections 20a, 20b, and 20c have been completely removed and thereby the top surfaces of the compound semiconductor layers 20A, 20B, and 20C have been flattened. FIG. 22 includes FIGS. 22A, 22B, and 22C which are cross-sectional views of the partial completed semiconductor device shown in FIG. 21 after the wet etching step has been completed.

FIG. 22A shows (111)A surfaces 14e and 14f formed in opposite sides of the upper semiconductor layer 14. FIG. 22B shows (111)A surfaces 14g and 14h formed in another pair of opposite sides of the upper semiconductor layer 14. FIG. 22C shows (111)A surfaces 14i and 14j formed in other pairs of opposite sides of the upper semiconductor layer 14. It should be noted that the etchant used in the above wet etching step may contain an oxidant.

Since optical multiplexer/demultiplexers using multimode interference have a plurality of optical waveguides connected to one another, a mask or masks having narrow and wide portions are required to manufacture an optical multiplexer/demultiplexer. In a semiconductor layer forming step for forming, e.g., compound semiconductor layers of an optical multiplexer/demultiplexer, a large amount of material migrates across the surface of the wide portion of the mask, resulting in large projections being formed on the compound semiconductor layers adjacent the sides of the mask. The method of manufacturing a semiconductor device (i.e., optical multiplexer/demultiplexer) in accordance with the fourth embodiment is therefore particularly advantageous since the method removes the projections on the compound semiconductor layers while avoiding detachment of the mask. Further, planarizing the surface of the compound semiconductor layers of the optical multiplexer/demultiplexer improves the transmission efficiency of the optical multiplexer/demultiplexer.

Figure 23A:
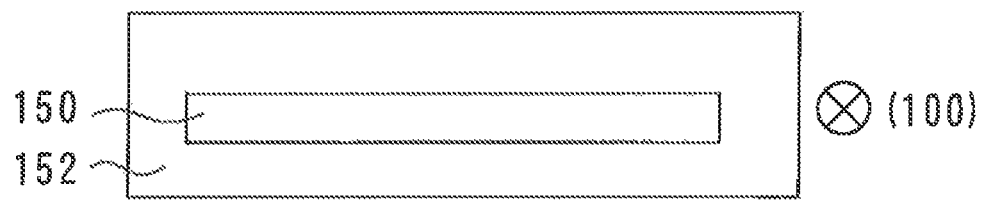
FIGS. 23A, 23B, 23C, 23D, 23E show variations in shape of the ridge stripe.
Figure 23B:
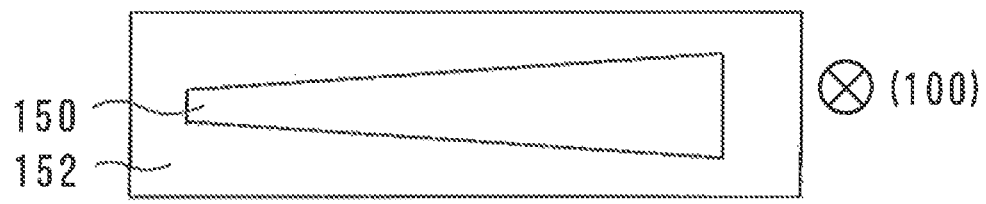
Figure 23C:
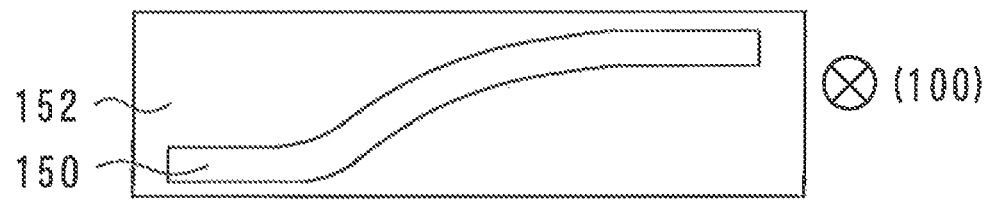
Figure 23D:
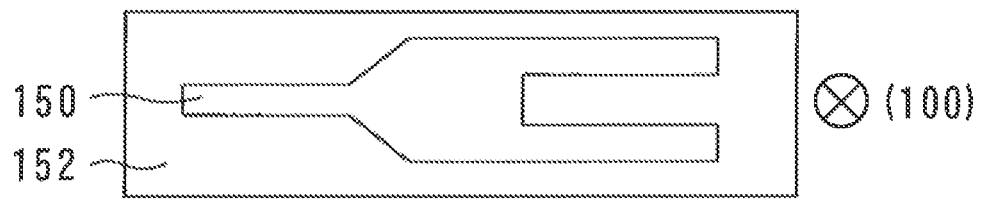
Figure 23E:
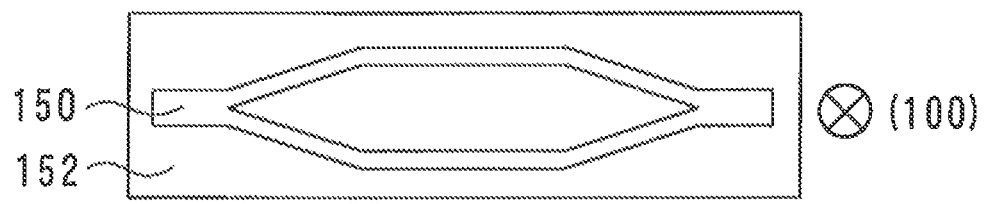

FIG. 23 includes FIGS. 23A to 23 E showing variations in shape of the ridge stripe shown in FIG. 18. The ridge stripe 150 shown in FIG. 23A has a straight shape. The ridge stripe 150 shown in FIG. 23B has a flared shape (or a gradually increasing width). The ridge stripe 150 shown in FIG. 23C is a bent optical waveguide. The ridge stripe 150 shown in FIG. 23D is bifurcated at one end. The ridge stripe 150 shown in FIG. 23E is a Mach-Zehnder waveguide. It should be noted that a ridge stripe has the same plan shape as the mask which has been used to form the ridge stripe. Therefore, the plan shape of a mask used for forming a ridge stripe may be determined in accordance with the desired plan shape of the ridge stripe. In this way a ridge stripe of any shape can be formed.

Features of embodiments described above may be combined where appropriate.

The laser sections 18 of the first to fourth embodiments have been described as having a very simple structure including an active layer 12, an upper semiconductor layer 14, and a mask 16. However, the laser section to which the present invention is applied need not have such a simple structure; the present invention can be applied to laser sections having different configurations. That is, various alterations may be made to the laser sections 18 of the first to fourth embodiments while retaining their basic layer structure (i.e., a layer structure including an active layer, an upper semiconductor layer, and a mask). For example, the upper semiconductor layer 14 of the laser section 18 of one or more of these embodiments may include a plurality of semiconductor layers, with the top semiconductor layer being a cladding layer.

Figure 24:
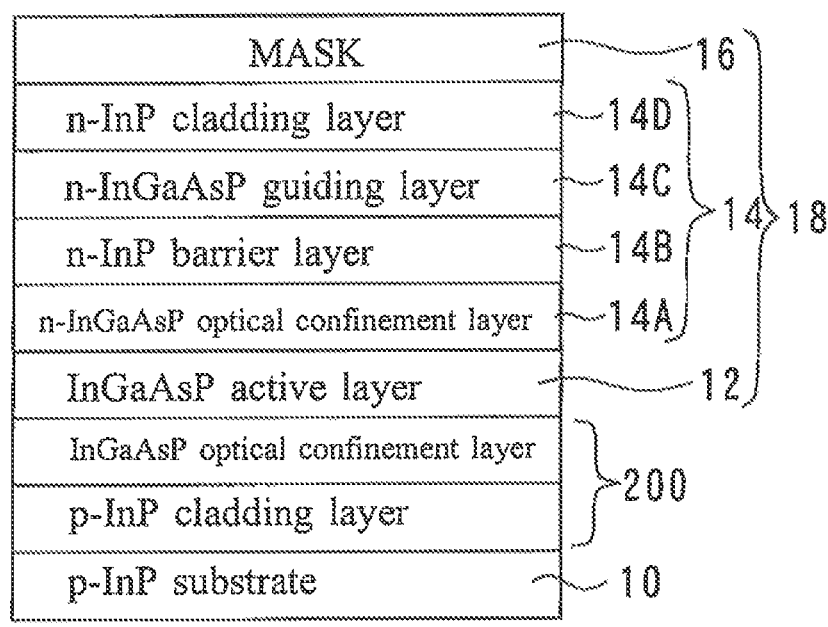
FIG. 24 is a diagram showing a variation of the laser sections of the first to fourth embodiments.

FIG. 24 is a diagram showing a variation of the laser sections 18 of the first to fourth embodiments. The laser section 18 shown in FIG. 24 is configured as a distributed feedback laser device (DFB-LD). The upper semiconductor layer 14 of this laser section 18 has a multilayer structure and includes an optical confinement layer 14A, a barrier layer 14B, a guiding layer 14C (having a diffraction grating structure), and a cladding layer 14D. A lower semiconductor layer 200 including an optical confinement layer and a cladding layer is formed between the active layer 12 of this laser section 18 and the substrate 10. The guiding layer 14C may be formed between the active layer 12 and the substrate 10. The cladding layer 14D may additionally serve as a contact layer or a capping layer. In such cases, the cladding layer 14D may be referred to as the "contact layer" or "capping layer." The substrate 10 may be formed of an n-type semiconductor.

In the method of manufacturing a semiconductor device including this laser section 18, compound semiconductor layers are formed to bury or surround the laser section 18 in a semiconductor layer forming step and then subjected to a wet etching step for removing projections (if any) on the compound semiconductor layers. This wet etching step results in a (111)A surface being formed in the cladding layer 14D, and the undercutting or lateral etching of the cladding layer 14D stops at this (111)A surface, making it possible to avoid exposure of the guiding layer 14C and minimize the amount of material etched from the cladding layer 14D. This also results in avoiding exposure of the active layer 12.

Thus, the present invention provides a method of manufacturing a semiconductor device having a laser section (or ridge stripe), which comprises a wet etching step for removing a projection on the compound semiconductor layer adjacent the laser section in such a manner that a (111)A surface is formed in the upper semiconductor layer on the active layer of the laser section, wherein the (111)A surface serves to stop undercutting or lateral etching of the upper semiconductor layer so as to avoid exposure of the active layer and minimize the amount of material etched from the upper semiconductor layer.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, comprising:

forming a laser section on a portion of a surface of a substrate, said laser section having side walls transverse to said surface of said substrate, wherein said laser section includes an active layer, an upper semiconductor layer on said active layer, and a mask on said upper semiconductor layer;

forming a compound semiconductor layer of an indium-containing material on said surface of said substrate and on both sides of said laser section, in contact with said side walls of said laser section, wherein said compound semiconductor layer includes projections projecting away from said surface of said substrate and located adjacent said side wall of said laser section;

wet etching and removing said projections with an etchant containing hydrobromic acid and acetic acid, thereby planarizing said compound semiconductor layer, and producing a (111)A surface in said upper semiconductor layer, under said mask;

after the wet etching, removing the mask; and after removing the mask, forming a contact layer in contact with said upper semiconductor layer and said compound semiconductor layer.

2. The method according to claim 1, wherein:

said side walls of said laser section contacted by said compound semiconductor layer are (011) or (0-1-1) surfaces; and said etchant contains an oxidant in addition to hydrobromic acid and acetic acid.

3. The method according to claim 1, wherein:

said upper semiconductor layer is InP; and said compound semiconductor layer is selected from the group consisting of InP, AlInP, InGaP, AlGaInP, InGaAsP, InAs, InGaAs, AlInAs, AlGaInAs, and GaInNAs.

4. The method according to claim 1, wherein said mask is a material that is etched at a lower rate than said projections in the wet etching.

5. The method according to claim 4, including epitaxially growing said mask on said upper semiconductor layer.

6. The method according to claim 1, wherein the wet etching exposes a (100) surface at a top surface of said compound semiconductor layer.

7. The method according to claim 1, wherein said compound semiconductor layer is configured as a current blocking layer, an optical modulator, an optical waveguide, an optical coupler, an optical amplifier, an EA modulator, or a phase modulator.

* * * * *